(12) United States Patent
Harris

(10) Patent No.: US 6,807,061 B1
(45) Date of Patent: Oct. 19, 2004

(54) STACK UP ASSEMBLY

(75) Inventor: Shaun L. Harris, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/425,491

(22) Filed: Apr. 28, 2003

(51) Int. Cl.$^7$ .................................................. H05K 7/20
(52) U.S. Cl. .................... 361/719; 361/720; 361/718; 361/717; 361/710; 257/707; 257/712; 257/713
(58) Field of Search ................................. 361/709, 702, 361/703, 704, 707, 710–722, 728; 257/706, 707, 712–724; 454/184–186; 312/236

(56) References Cited

U.S. PATENT DOCUMENTS

| | | | | |
|---|---|---|---|---|
| 4,965,710 A | * | 10/1990 | Pelly et al. | 363/56.03 |
| 5,023,752 A | * | 6/1991 | Detter et al. | 361/752 |
| 5,390,078 A | * | 2/1995 | Taylor | 361/721 |
| 5,424,919 A | * | 6/1995 | Hielbronner | 361/710 |
| 5,548,090 A | * | 8/1996 | Harris | 174/252 |
| 5,586,006 A | * | 12/1996 | Seyama et al. | 361/719 |
| 5,587,882 A | * | 12/1996 | Patel | 361/705 |
| 5,734,555 A | * | 3/1998 | McMahon | 361/704 |
| 5,742,477 A | * | 4/1998 | Baba | 361/704 |
| 5,862,038 A | * | 1/1999 | Suzuki et al. | 361/704 |
| 5,930,115 A | * | 7/1999 | Tracy et al. | 361/704 |
| 5,986,887 A | * | 11/1999 | Smith et al. | 361/704 |
| 6,058,013 A | * | 5/2000 | Christopher et al. | 361/704 |
| 6,239,366 B1 | * | 5/2001 | Hsuan et al. | 174/52.3 |
| 6,256,201 B1 | * | 7/2001 | Ikeda et al. | 361/704 |
| 6,269,866 B1 | * | 8/2001 | Yamamoto et al. | 165/104.26 |
| 6,414,867 B2 | * | 7/2002 | Suzuki et al. | 363/141 |
| 6,452,113 B2 | | 9/2002 | Dibene | |
| 6,452,804 B1 | | 9/2002 | Dibene | |
| 6,462,410 B1 | * | 10/2002 | Novotny et al. | 257/707 |
| 6,483,704 B2 | * | 11/2002 | Ulen et al. | 361/704 |
| 6,490,161 B1 | * | 12/2002 | Johnson | 361/704 |
| 6,621,701 B2 | * | 9/2003 | Tamba et al. | 361/699 |
| 6,771,507 B1 | * | 8/2004 | Belady et al. | 361/704 |
| 2002/0036889 A1 | * | 3/2002 | Ruiz-Gomez et al. | 361/695 |
| 2002/0164895 A1 | | 11/2002 | Hartke | |

FOREIGN PATENT DOCUMENTS

| | | | | |
|---|---|---|---|---|
| JP | 2004063604 A | * | 2/2004 | H01L/25/07 |
| JP | 2004140159 A | * | 5/2004 | H01L/23/36 |

OTHER PUBLICATIONS

U.S. patent application No. 10/355,707; Christian L. Belady et al; "Power Module For Multi–Chip Printed Circuit Boards"; filed Jan. 31, 2003.

U.S. patent application No. 10/355,424; Brent A. Boudreaux; "Cooling Apparatus For Stacked Components"; filed Jan. 31, 2003.

* cited by examiner

Primary Examiner—Anatoly Vortman
(74) Attorney, Agent, or Firm—Leslie P. Gehman

(57) ABSTRACT

A first printed circuit board is built including one or more openings configured to correspond to heat-generating devices attached to a second printed circuit board. The first and second printed circuit boards are aligned with each other and a heat sink, such that the heat sink is thermally coupled with heat-generating electronic devices on both the first and second printed circuit boards. Optionally, the first and second printed circuit boards may be electrically coupled with each other through an electrical connector. Also optionally, heat-generating devices may be mechanically and electrically coupled with the second printed circuit board through interposers configured (upon assembly) to raise the heat-generating devices through the openings in the first printed circuit board to contact a heat sink.

38 Claims, 9 Drawing Sheets

Section A-A

Section B-B

Section C-C

STACK UP ASSEMBLY

FIELD OF THE INVENTION

The present invention relates generally to the field of heat sinks and more specifically to the field of heat sinks configured to conduct heat from heat-generating devices on two different printed circuit boards.

BACKGROUND OF THE INVENTION

Modern electronics have benefited from the ability to fabricate devices on a smaller and smaller scale. As the ability to shrink devices has improved, so has their performance. Unfortunately, this improvement in performance is accompanied by an increase in power as well as power density in devices, resulting in large amounts of heat. In order to maintain the reliability of these devices, the industry must find new methods to remove this heat efficiently.

Many current systems include a plurality of printed circuit boards. These boards may each include a plurality of heat-generating devices requiring cooling to remain within their operating temperatures. Some commonly available current systems configure the printed circuit boards such that they are parallel with each other and then force airflow across the printed circuit boards, thus cooling the heat-generating devices attached to the printed circuit boards. The individual heat-generating devices may include heat sinks to make more efficient use of the heat transfer properties of the airflow. However, as devices shrink in size and heat generation increases, standard techniques such as individual heat sinks and wide gaps between parallel printed circuit boards are no longer sufficient to provide the compact size required of many devices today.

Some printed circuit boards and their devices are configured to allow the use of a single heat sink across a plurality of individual heat-generating devices. This allows the use of larger heat sinks that are more efficient and cheaper and easier to manufacture than a plurality of individual heat sinks. Often, two printed circuit boards contain devices with functions that must be closely mated for optimal performance. For example, a power module board is most effective when it is as close as possible to the printed circuit board including the ASICs or microprocessors to which the power module board is supplying power. This closeness reduces voltage drops along the, now shortened, interconnect between the power module and the ASICs or microprocessors. Typically, devices on both the power module board and the microprocessor printed circuit board require heat sinks to efficiently dissipate the heat generated by the heat-generating devices on those boards. One technique involves placing the power module board and the printed circuit board back-to-back with their heat sinks facing outwards from the two boards. However, this technique results in a system requiring two airflows over the two sets of heat sinks for efficient cooling. This requirement causes the overall volume of the completed device to increase, along with the cost of providing two airflows. Similarly, when a single printed circuit board is used and the power module is placed on the opposing side of the printed circuit board, two sets of heat sinks and two airflows are still required. Other configurations may place the power module components on the same side of a single printed circuit board with the other components, reducing the airflows required to one. However, this configuration may not allow the shortest possible power supply connections to the ASICs, microprocessors, or other devices.

SUMMARY OF THE INVENTION

A first printed circuit board is built including one or more openings configured to correspond to heat-generating devices attached to a second printed circuit board. The first and second printed circuit boards are aligned with each other and a heat sink, such that the heat sink is thermally coupled with heat-generating devices on both the first and second printed circuit boards. Within the scope of the present invention the heat sink may be a heat spreader, cold plate, refrigeration (evaporative cooling) plate, heat pipe or any other device configured to remove heat from the heat-generating devices. Optionally, the first and second printed circuit boards may be electrically coupled with each other through an electrical connector. Also optionally, heat-generating devices may be mechanically and electrically coupled with the second printed circuit board through interposers configured (upon assembly) to raise the heat-generating electronic devices through the openings in the first printed circuit board to contact a heat sink.

Other aspects and advantages of the present invention will become apparent from the following detailed description, taken in conjunction with the accompanying drawings, illustrating by way of example the principles of the invention.

DETAILED DESCRIPTION

Figure 1A:
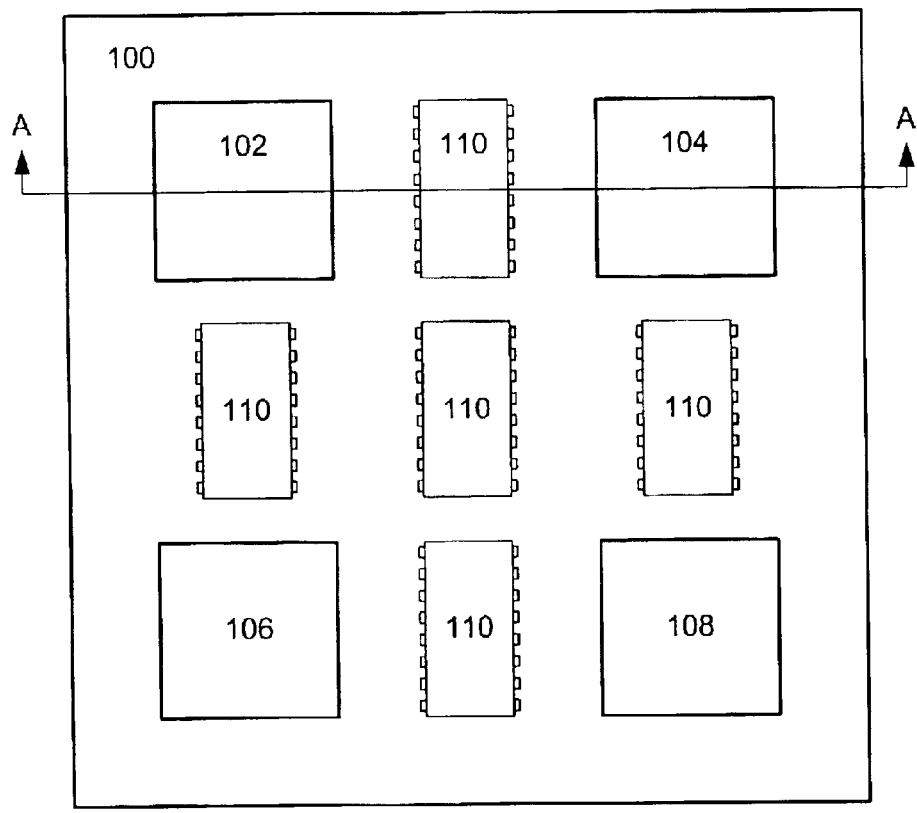
FIG. 1A is a top view of an example embodiment of a first printed circuit board including heat-generating devices according to the present invention.
Figure 5A:
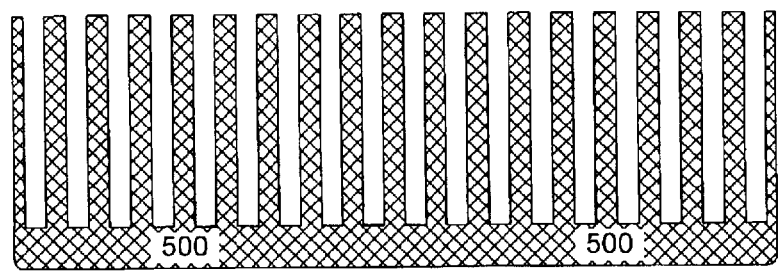
FIG. 5A is a cross-sectional view of an example stack up assembly before assembly of the example embodiments of first and second printed circuit boards from FIGS. 1 and 4 along with an example embodiment of a heat sink according to the present invention.
Figure 5A:
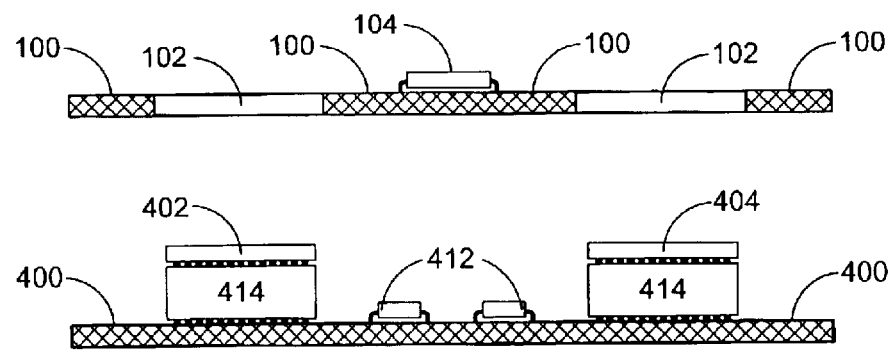
Figure 5B:
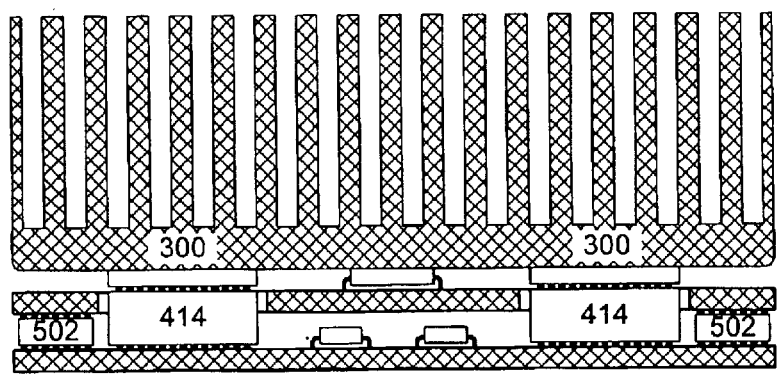
FIG. 5B is a cross-sectional view of an example stack up assembly after complete assembly of the example embodiments of first and second printed circuit boards from FIGS. 1 and 4 along with an example embodiment of a heat sink according to the present invention.

FIG. 1A is a top view of an example embodiment of a first printed circuit board including heat-generating electronic devices according to the present invention. In this example embodiment of the present invention a first printed circuit board 100 including a first opening 102, a second opening 104, a third opening 106, and a fourth opening 108 is provided. Other embodiments of the present inventions may include any number of openings as needed for a particular implementation of the present invention. Also included on this first printed circuit board 100 are a number of first heat-generating devices 110. The terminology "first heat-generating devices" is used to distinguish these heat-generating devices on the first printed circuit board from those present on the second printed circuit board discussed below. As shown in FIGS. 5A and 5B, an upper surface of the first heat-generating devices may be substantially coplanar with (or even above) an upper surface of the heat-generating devices on the second printed circuit board. While this example embodiment of the present invention included five first heat-generating devices 110, other embodiments may include any number of first heat-generating devices 110 as needed for a particular implementation of the present invention. These first heat-generating devices 110 may include electronic power circuits, application specific integrated circuits (ASICs), microprocessors, discrete electronic devices such as field effect transistors (FETs), other types of transistors, or other heat-generating electronic devices as needed for a particular implementation of the present invention. In some embodiments of the present invention this first printed circuit board 100 may be a power module circuit board, a voltage regulation module (VRM) circuit board, or any other type of device as needed for a particular implementation of the present invention.

Figure 1B:
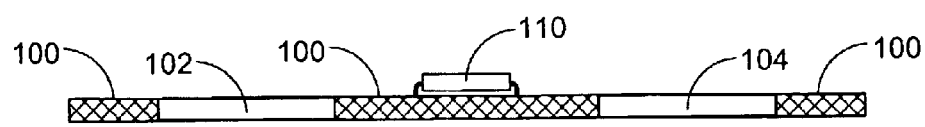
FIG. 1B is a cross-sectional view of the example embodiment of a first printed circuit board from FIG. 1A along section line A—A.

FIG. 1B is a cross-sectional view of the example embodiment of a first printed circuit board from FIG. 1A along section line A—A. In this example embodiment of the present invention, the first printed circuit board 100 is shown with a first opening 102, and a second opening 104. Also shown in this cross-sectional view is one of the upper heat-generating electronic devices 110 from FIG. 1A.

Figure 2A:
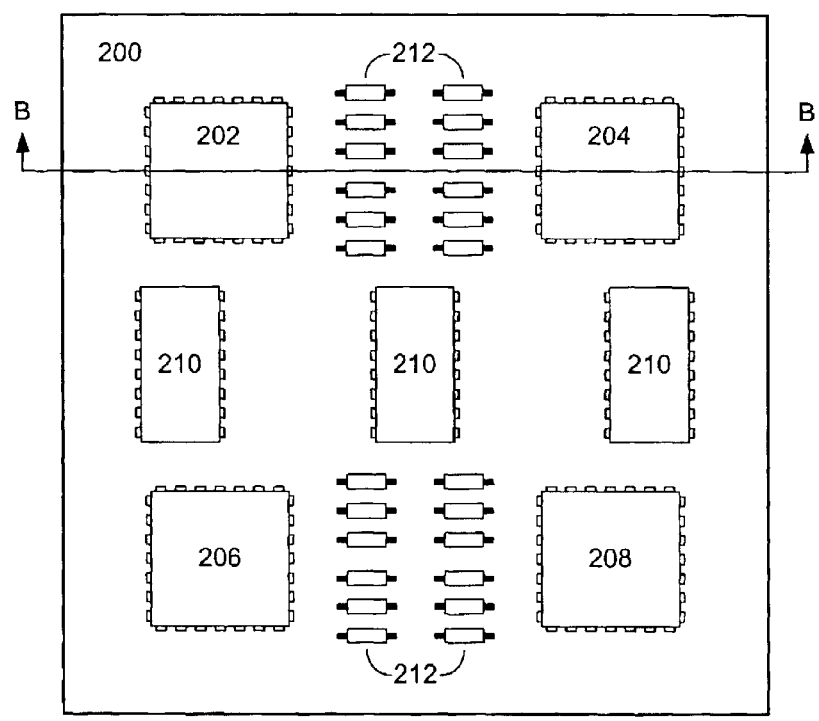
FIG. 2A is a top view of an example embodiment of a second printed circuit board including heat-generating devices according to the present invention.

FIG. 2A is a top view of an example embodiment of a second printed circuit board including heat-generating devices according to the present invention. In this example embodiment of the present invention a second printed circuit board 200 is provided including a second heat-generating device 202, a third heat-generating device 204, a fourth heat-generating device 206, and a fifth heat-generating device 208. Other embodiments of the present invention may include any number of heat-generating devices as needed for a particular implementation of the invention. These heat-generating devices 202, 204, 206, and 208 may include electronic power circuits, application specific integrated circuits (ASICs), microprocessors, discrete electronic devices such as field effect transistors (FETs), other types of transistors, or other heat-generating devices as needed for a particular implementation of the present invention. Also included on this second printed circuit board 200 are a number of other devices 210 that may or may not generate heat, along with a plurality of discrete devices 212, (such as resistors, capacitors, transistors, and diodes, for example) that also may or may not generate heat. Those of skill in the art will recognize that any of the printed circuit boards may include discrete devices 212, or other heat-generating devices that are not directly coupled with the heat sink.

Figure 2B:
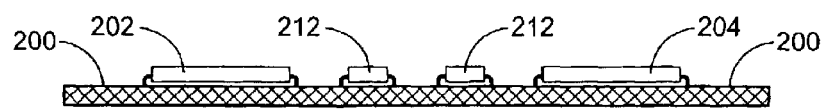
FIG. 2B is a cross-sectional view of the example embodiment of a second printed circuit board from FIG. 2A along section line B—B.

FIG. 2B is a cross-sectional view of the example embodiment of a second printed circuit board from FIG. 2A along section line B—B. In this example embodiment of the present invention, the second printed circuit board 200 is shown with a second heat-generating device 202, a third heat-generating device 204, and two discrete devices 212.

Figure 3A:
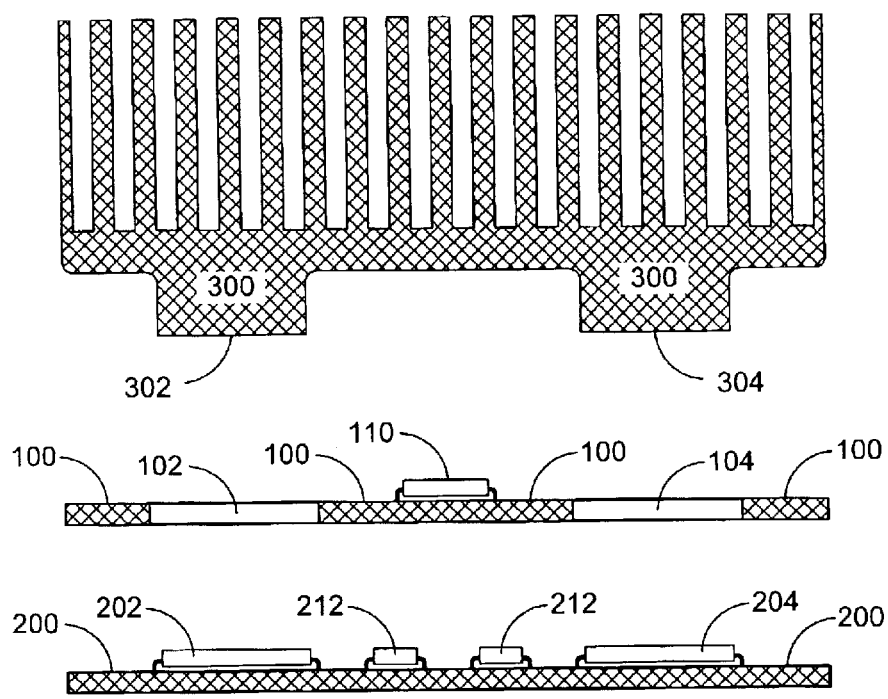
FIG. 3A is a cross-sectional view of an example stack up assembly before assembly of the example embodiments of first and second printed circuit boards from FIGS. 1 and 2 along with an example embodiment of a heat sink according to the present invention.
Figure 3B:
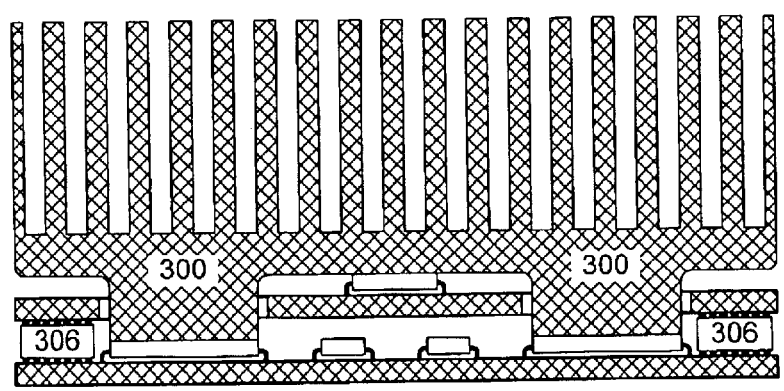
FIG. 3B is a cross-sectional view of an example stack up assembly after complete assembly of the example embodiments of first and second printed circuit boards from FIGS. 1 and 2 along with an example embodiment of a heat sink according to the present invention.

FIG. 3A is a cross-sectional view of an example stack up assembly before assembly of the example embodiments of first and second printed circuit boards from FIGS. 1 and 2 along with an example embodiment of a heat sink according to the present invention. This example embodiment of a stack up according to the present invention includes the first printed circuit board 100 from FIG. 1, the second printed circuit board 200 from FIG. 2, along with an example embodiment of a heat sink 300 according to the present invention. Those of skill in the art will recognize that a wide variety of thermal devices may be used as a heat sink 300. While a standard finned heat sink 300 is shown in FIGS. 3A and 3B, other example embodiments of the present invention may use heat spreaders, cold plates, refrigeration (evaporative cooling) plates, heat pipes, or other thermal devices in place of the finned heat sink shown in these figures. This cross-sectional view of an example stack up shows the first printed circuit board 100 from FIG. 1B and the second printed circuit board 200 from FIG. 2B. In this example embodiment of the present invention, the first printed circuit board 100 is shown with a first opening 102, and a second opening 104. Also shown in this cross-sectional view is one of the first heat-generating devices 110 from FIG. 1A. In this example embodiment of the present invention, the second printed circuit board 200 is shown with a second heat-generating device 202, a third heat-generating device 204, and two discrete devices 212. Note that the heat sink 300 includes a first protrusion 302, and a second protrusion 304 configured to pass through the first opening 102 and the second opening 104 of the first printed circuit board 100 and make contact with the second heat-generating device 202 and the third heat-generating device 204 on the second printed circuit board 200. Those of skill in the art will recognize that there is no requirement that the bottom surfaces of the first protrusion 302 and the second protrusion 304 be co-planar. Note that in some embodiments of the present invention, the heat sink 300 may be a thermal plate, a vapor plate, a heat pipe, or any other thermal device capable of removing heat from the heat-generating devices on the first and second printed circuit boards.

FIG. 3B is a cross-sectional view of an example stack up assembly after complete assembly of the example embodiments of first and second printed circuit boards from FIGS. 1 and 2 along with an example embodiment of a heat sink according to the present invention. After the example stack up shown in FIG. 3A is assembled, the first printed circuit board 100 is mechanically and electrically coupled with the second printed circuit board 200 through one or more electrical connectors 306. These electrical connectors 306 may be configured to set the distance between the first and second printed circuit boards 100, and 200 such that the heat sink 300 makes thermal contact with the first heat-generating devices 110 on the first printed circuit board 100 along with the heat-generating devices 202, and 204 on the second printed circuit board 200. The discrete devices 212 attached to the second printed circuit board 200 in this example embodiment of the present invention are not thermally coupled to the heat sink. Those of skill in the art will recognize that these discrete devices 212 may not require cooling through the heat sink 300 if their heat output is low. Also, there may be some cooling of these devices 212 by air flowing between the first and second printed circuit boards 100, and 200. While this example stack up of the present invention shows two openings 102, and 104 in the first printed circuit board 100 and two heat-generating devices 202, and 204 attached to the second printed circuit board 200, those of skill in the art will recognize that any number of openings in the first printed circuit board 100 may be used to provide heat sink access to any number of heat generating devices on the second printed circuit board 200.

Figure 4A:
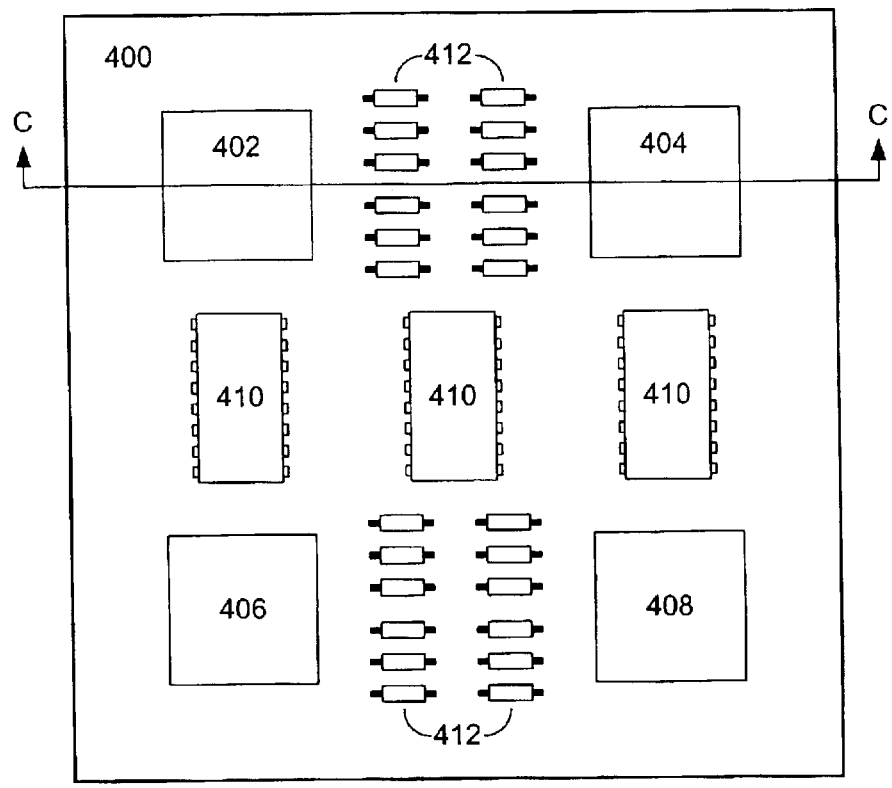
FIG. 4A is a top view of an example embodiment of a second printed circuit board including heat-generating devices according to the present invention.
Figure 4B:
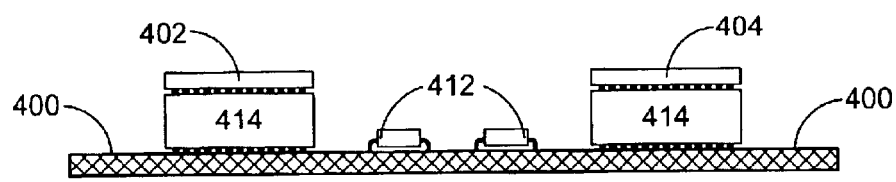
FIG. 4B is a cross-sectional view of the example embodiment of a second printed circuit board from FIG. 4A along section line C—C.

FIG. 4A is a top view of an example embodiment of a second printed circuit board including heat-generating devices according to the present invention. This example embodiment of the present invention is similar to that shown in FIGS. 2A and 2B. However, in this example embodiment of the present invention, the heat-generating devices 402, 404, 406, and 408 are packaged in pin grid array (PGA) packages and supported by interposers 414 attached to the second printed circuit board 400. In this example embodiment of the present invention a second printed circuit board 400 is provided including a second heat-generating device 402, a third heat-generating device 404, a fourth heat-generating device 406, and a fifth heat-generating device 408. These heat-generating devices 402, 404, 406, and 408 are mechanically and electrically coupled with the second printed circuit board 400 through interposers 414 that are shown in FIG. 4B. Other embodiments of the present invention may include any number of heat-generating devices as needed for a particular implementation of the invention. These heat-generating devices 402, 404, 406, and 408 may include electronic power circuits, application specific integrated circuits (ASICs), microprocessors, transistors, discrete devices, or other heat-generating electronic devices as needed for a particular implementation of the present invention. Also included on this second printed circuit board 400 are a number of other devices 410 that may or may not generate heat, along with a plurality of discrete devices 412, (such as resistors, capacitors, transistors, and diodes, for example) that also may or may not generate heat.

FIG. 4B is a cross-sectional view of the example embodiment of a second printed circuit board from FIG. 4A along section line C—C. In this example embodiment of the present invention, the second printed circuit board 400 is shown with a second heat-generating device 402, a third heat-generating device 404, and two discrete devices 412. The second and third heat-generating devices 402, and 404 are mechanically and electrically coupled to the second printed circuit board 400 through interposers 414. Note that in some example embodiments of the present invention the interposers 414 may also include a socket configured to allow insertion and removal of the heat-generating devices 402, and 404.

FIG. 5A is a cross-sectional view of an example stack up assembly before assembly of the example embodiments of first and second printed circuit boards from FIGS. 1 and 4 along with an example embodiment of a heat sink according to the present invention. This example embodiment of a stack up according to the present invention includes the first printed circuit board 100 from FIG. 1, the second printed circuit board 400 from FIG. 4, along with an example embodiment of a heat sink 500 according to the present invention. This cross-sectional view of an example stack up shows the first printed circuit board 100 from FIG. 1B and the second printed circuit board 400 from FIG. 4B. In this example embodiment of the present invention, the first printed circuit board 100 is shown with a first opening 102, and a second opening 104. Also shown in this cross-sectional view is one of the first heat-generating devices 110 from FIG. 1A. In this example embodiment of the present invention, the second printed circuit board 400 is shown with a second heat-generating device 402, a third heat-generating device 404, two discrete devices 412, and two interposers 414 supporting the second and third heat-generating devices 402, and 404. Note that the heat sink 500 includes a flat bottom unlike the heat sink 300 shown in FIG. 3.

FIG. 5B is a cross-sectional view of an example stack up assembly after complete assembly of the example embodiments of first and second printed circuit boards from FIGS. 1 and 4 along with an example embodiment of a heat sink according to the present invention. After the example stack up shown in FIG. 5A is assembled, the first printed circuit board 100 is mechanically and electrically coupled with the second printed circuit board 400 through one or more electrical connectors 502. These electrical connectors 502 may be configured to set the distance between the first and second printed circuit boards 100, and 400 such that the heat sink 500 makes thermal contact with the first heat-generating devices 110 on the first printed circuit board 100 along with the heat-generating devices 402, and 404 on the second printed circuit board 400. Note that the interposers 414 mechanically and electrically coupling the heat-generating devices 402, and 404 to the second printed circuit board 400 are configured to position the heat-generating devices such that their top surfaces are substantially co-planar with each other and the heat-generating devices 104 attached to the first printed circuit board 100. This allows the use of a single heat sink 500 with a substantially planar bottom surface to contact all of the heat-generating devices 104, 402, and 404 on the first and second printed circuit boards 100, and 200 that the designer desires to be thermally coupled to the heat sink 500. The discrete devices 412 attached to the second printed circuit board 400 in this example embodiment of the present invention are not thermally coupled to the heat sink. Those of skill in the art will recognize that these discrete devices 412 may not require cooling through the heat sink 500 if their heat output is low. Also, there may be some cooling of these devices 412 by air flowing between the first and second printed circuit boards 100, and 400. While this example stack up of the present invention shows two openings 102, and 104 in the first printed circuit board 100 and two heat-generating devices 402, and 404 attached to the second printed circuit board 400, those of skill in the art will recognize that any number of openings in the first printed circuit board 100 may be used to provide heat sink access to any number of heat generating devices on the second printed circuit board 400.

Figure 6:
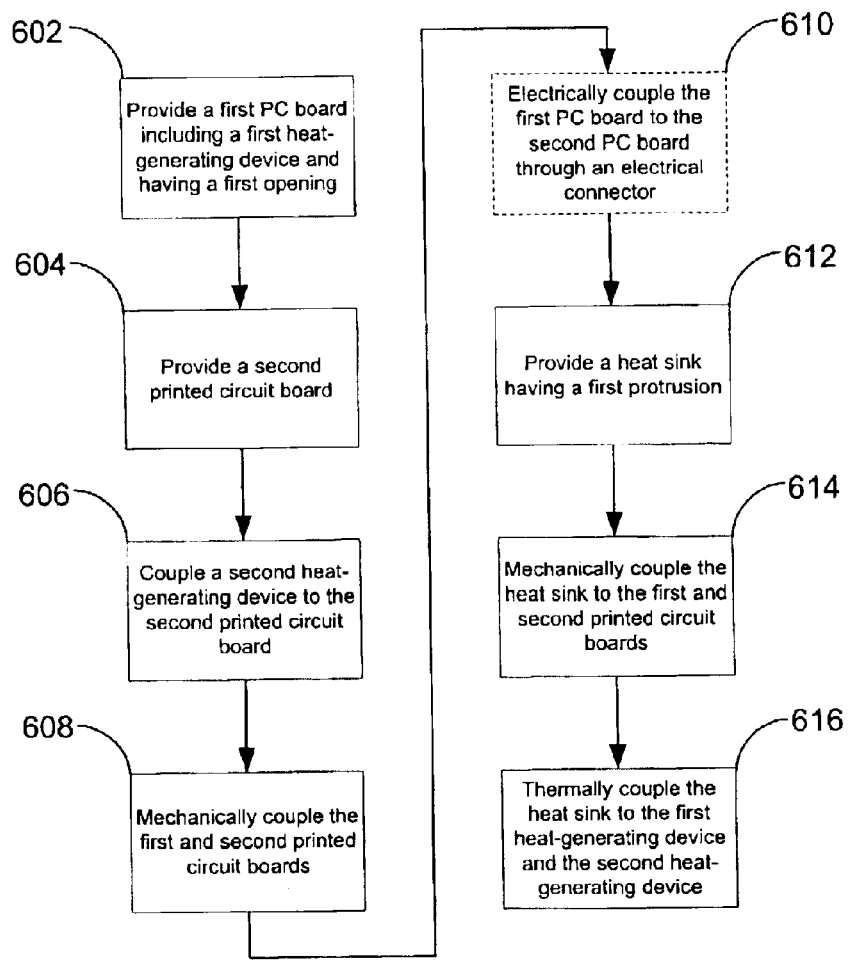
FIG. 6 is a flow chart of an example method for the construction of a stack up including first and second printed circuit boards cooled by a single heat sink according to the present invention.

FIG. 6 is a flow chart of an example method for the construction of a stack up including first and second printed circuit boards cooled by a single heat sink according to the present invention. In a step 602, a first printed circuit board including a first heat-generating device and having a first opening is provided. In a step 604, a second printed circuit board is provided. In a step 606, a second heat-generating device is electrically and mechanically coupled to the second printed circuit board. In a step 608, the first and second printed circuit boards are mechanically coupled. In an optional step 610, the first and second printed circuit boards are electrically coupled through an electrical connector. In a step 612, a heat sink having a first protrusion is provided. In a step 614, the heat sink is mechanically coupled to the first and second printed circuit boards. In a step 616, the heat sink is thermally coupled to the first heat-generating device and the second heat-generating device.

Figure 7:
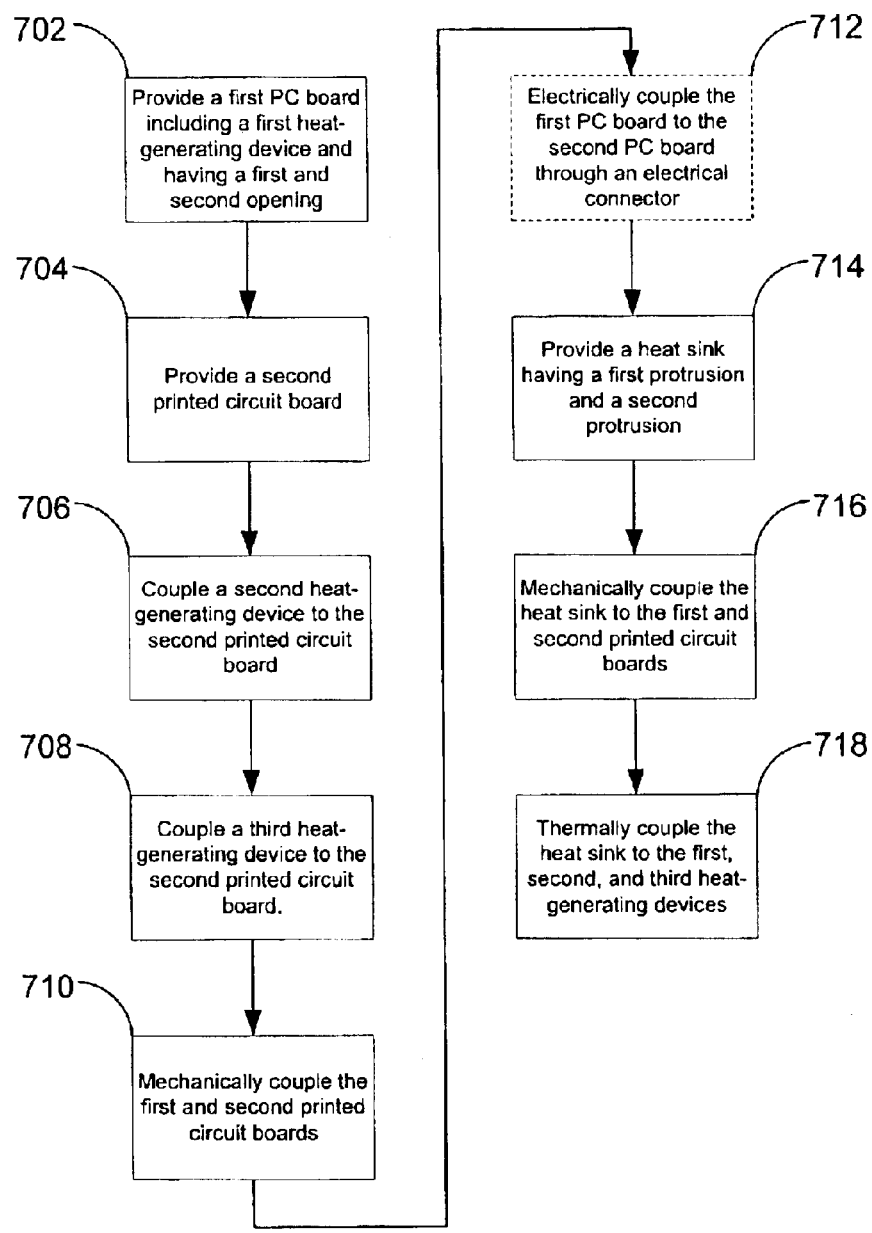
FIG. 7 is a flow chart of an example method for the construction of a stack up including first and second printed circuit boards cooled by a single heat sink according to the present invention.

FIG. 7 is a flow chart of an example method for the construction of a stack up including first and second printed circuit boards cooled by a single heat sink according to the present invention. In a step 702, a first printed circuit board including a first heat-generating device and having first and second openings is provided. In a step 704, a second printed circuit board is provided. In a step 706, a second heat-generating device is electrically and mechanically coupled to the second printed circuit board. In a step 708, a third heat-generating device is electrically and mechanically coupled to the second printed circuit board. In a step 710, the first and second printed circuit boards are mechanically coupled. In an optional step 712, the first and second printed circuit boards are electrically coupled through an electrical connector. In a step 714, a heat sink having a first and second protrusion is provided. In a step 716, the heat sink is mechanically coupled to the first and second printed circuit boards. In a step 718, the heat sink is thermally coupled to the first, second, and third heat-generating devices.

Figure 8:
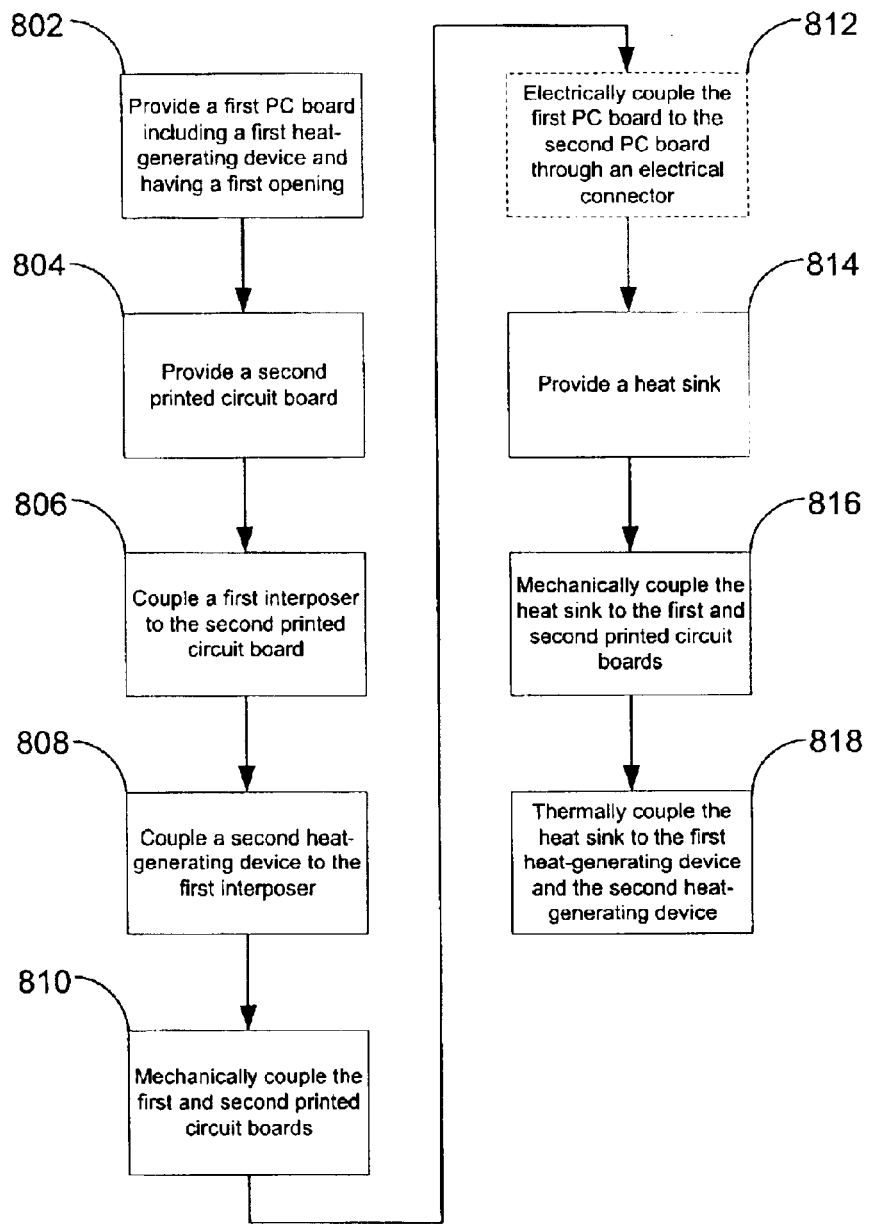
FIG. 8 is a flow chart of an example method for the construction of a stack up including first and second printed circuit boards cooled by a single heat sink according to the present invention.

FIG. 8 is a flow chart of an example method for the construction of a stack up including first and second printed circuit boards cooled by a single heat sink according to the present invention. In a step 802, a first printed circuit board including a first heat-generating device and having a first opening is provided. In a step 804, a second printed circuit board is provided. In a step 806, a first interposer is electrically and mechanically coupled to the second printed circuit board. In a step 808, a second heat-generating device is electrically and mechanically coupled to the first interposer. In a step 810, the first and second printed circuit boards are mechanically coupled. In an optional step 812, the first and second printed circuit boards are electrically coupled through an electrical connector. In a step 814, a heat sink is provided. In a step 816, the heat sink is mechanically coupled to the first and second printed circuit boards. In a step 818, the heat sink is thermally coupled to the first and second heat-generating devices.

Figure 9:
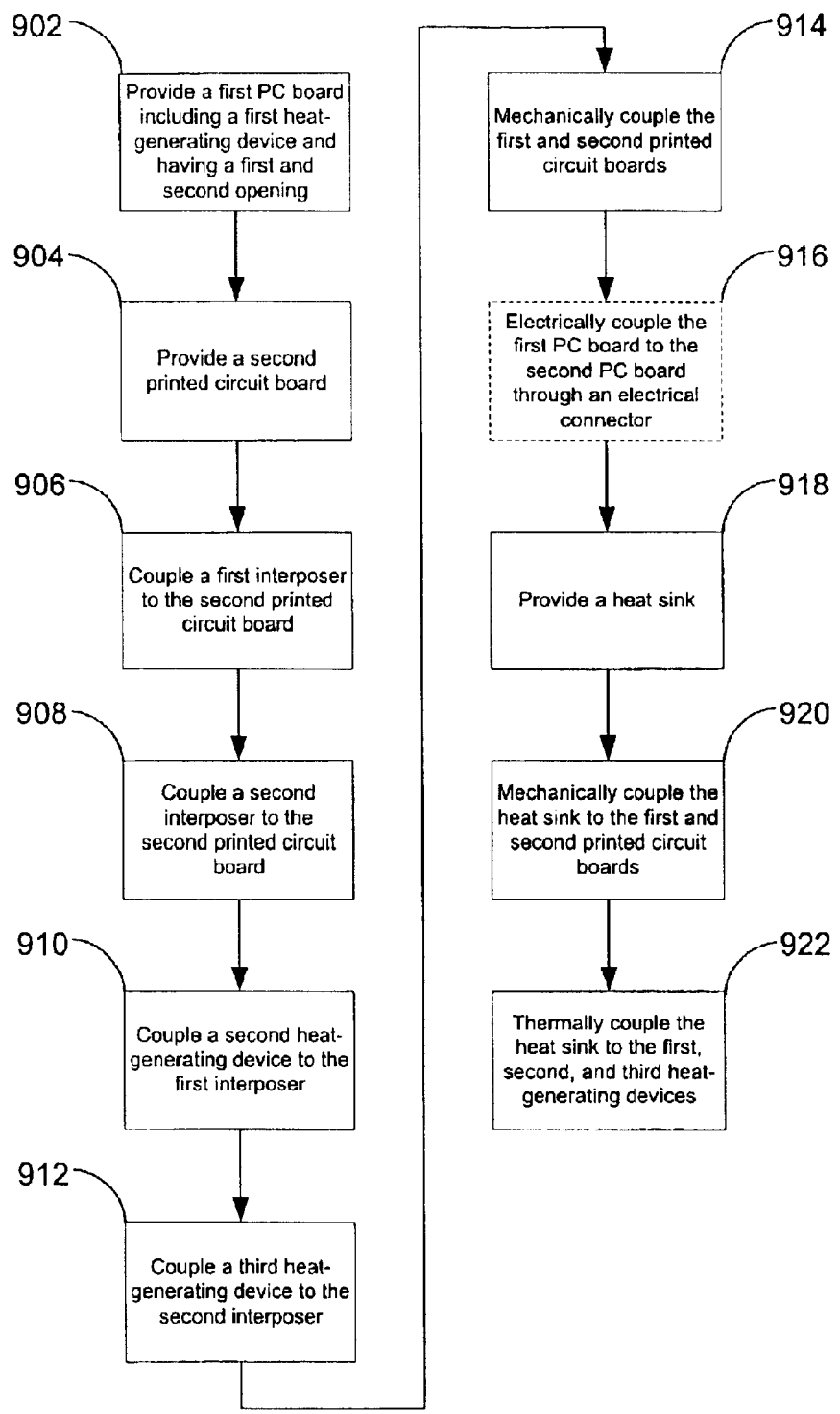
FIG. 9 is a flow chart of an example method for the construction of a stack up including first and second printed circuit boards cooled by a single heat sink according to the present invention.

FIG. 9 is a flow chart of an example method for the construction of a stack up including first and second printed circuit boards cooled by a single heat sink according to the present invention. In a step 902, a first printed circuit board including a first heat-generating device and having first and second openings is provided. In a step 904, a second printed circuit board is provided. In a step 906, a first interposer is electrically and mechanically coupled to the second printed circuit board. In a step 908, a second interposer is electrically and mechanically coupled to the second printed circuit board. In a step 910, a second heat-generating device is electrically and mechanically coupled to the first interposer. In a step 912, a third heat-generating device is electrically and mechanically coupled to the second interposer. In a step 914, the first and second printed circuit boards are mechanically coupled. In an optional step 916, the first and second printed circuit boards are electrically coupled through an electrical connector. In a step 918, a heat sink is provided. In a step 920, the heat sink is mechanically coupled to the first and second printed circuit boards. In a step 922, the heat sink is thermally coupled to the first, second, and third heat-generating devices.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An assembly, comprising:
    a first printed circuit board having a first opening and including a first heat-generating device;
    a second printed circuit board;
    a second heat-generating device mechanically and electrically coupled with said second printed circuit board, and substantially aligned with said first opening in said first printed circuit board; and
    a heat sink having a first protrusion configured to extend through the first opening in said first printed circuit board, wherein said heat rink makes thermal contact with said first heat-generating device on said first printed circuit board, and wherein said heat sink first protrusion makes thermal contact with said second heat-generating device on said second printed circuit board.

2. The assembly of claim 1, wherein said first heat-generating device is an ASIC.

3. The assembly of claim 1, wherein said first heat-generating device is a microprocessor.

4. The assembly of claim 1, wherein said first heat-generating device is a FET.

5. The assembly of claim 1, wherein said second heat-generating device is an ASIC.

6. The assembly of claim 1, wherein said second heat-generating device is a microprocessor.

7. The assembly of claim 1, wherein said second heat-generating device is a FET.

8. The assembly of claim 1, wherein said first printed circuit board including a first heat-generating device is a power module.

9. The assembly of claim 1, wherein said second printed circuit board including a second heat-generating device is a power module.

10. The assembly of claim 1, wherein said first printed circuit board is a voltage regulation module (VRM) circuit board.

11. The assembly of claim 1, wherein said second printed circuit board is a voltage regulation module (VRM) circuit board.

12. The assembly of claim 1, further comprising:
    an electrical connector coupled to electrically couple said first printed circuit board to said second printed circuit board.

13. The assembly of claim 1, wherein said first printed circuit board also has a second opening.

14. The assembly of claim 13, further comprising:
a third heat-generating device mechanically and electrically coupled with said second printed circuit board, and substantially aligned with said second opening in said first printed circuit board.

15. The assembly of claim 14, wherein said heat sink also has a second protrusion configured to extend through the second opening in said first printed circuit board, wherein said heat sink second protrusion makes thermal contact with said third heat-generating device on said second printed circuit board.

16. The assembly of claim 15, wherein said third heat-generating device is an ASIC.

17. The assembly of claim 15, wherein said third heat-generating device is a microprocessor.

18. The assembly of claim 15, wherein said third heat-generating device is a FET.

19. The assembly of claim 15, further comprising:
an electrical connector configured to electrically couple said first printed circuit board to said second printed circuit board.

20. A method for the construction of an assembly, comprising the steps of:
a) providing a first printed circuit board including a first heat-generating device and having a first opening;
b) providing a second printed circuit board;
c) mechanically and electrically coupling a second heat-generating device to the second printed circuit board in a location corresponding to the first opening in the first printed circuit board;
d) providing a heat sink having a first protrusion confided to extend through the first opening in the first printed circuit board and make thermal contact with the second heat-generating device on the second printed circuit board;
e) mechanically coupling the first printed circuit board with the second printed circuit board such that the second heat-generating device on the second printed circuit board is substantially aligned under the first opening in the first printed circuit board; and
f) mechanically coupling the heat sink to the first and second printed circuit boards such that the first protrusion of the heat sink extends through the first opening in the first printed circuit board and makes thermal contact with the second heat-generating device on the second printed circuit board, and the heat sink makes thermal contact with the first heat-generating device on the first printed circuit board.

21. The method of claim 20, wherein the first heat-generating device is an ASIC.

22. The method of claim 20, wherein the first heat-generating device is a microprocessor.

23. The method of claim 20, wherein the first heat-generating device is a FET.

24. The method of claim 20, wherein the second heat-generating device is an ASIC.

25. The method of claim 20, wherein the second heat-generating device is a microprocessor.

26. The method of claim 20, wherein the second heat-generating device is a FET.

27. The method of claim 20, wherein the first printed circuit board including a first heat-generating device is a power module.

28. The method of claim 20, wherein the second printed circuit board including a second heat-generating device is a power module.

29. The method of claim 20, wherein the first printed circuit board is a voltage regulation module (VRM) circuit board.

30. The method of claim 20, wherein the second printed circuit board is a voltage regulation module (VRM) circuit board.

31. The method of claim 20, further comprising the step of:
g) electrically coupling the first printed circuit board to the second printed circuit board through an electrical connector.

32. The method of claim 20, wherein the first printed circuit board also has a second opening.

33. The method of claim 32, further comprising the step of:
g) mechanically and electrically coupling a third heat-generating device to the second printed circuit board in a location corresponding to the second opening in the first printed circuit board.

34. The method of claim 33, wherein said heat sink also has a second protrusion configured to extend through the second opening in the first printed circuit board and make thermal contact with the third heat-generating device on the second printed circuit board.

35. The method of claim 34, wherein the third heat-generating device is an ASIC.

36. The method of claim 34, wherein the third heat-generating device is a microprocessor.

37. The method of claim 34, wherein the third heat-generating device is a FET.

38. The method of claim 34, further comprising the step of:
g) electrically coupling the first printed circuit board to the second printed circuit board through an electrical connector.

* * * * *